United States Patent

Huang

(10) Patent No.: US 8,519,487 B2
(45) Date of Patent: Aug. 27, 2013

(54) SEMICONDUCTOR DEVICE

(75) Inventor: Wei-Hang Huang, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/052,115

(22) Filed: Mar. 21, 2011

(65) Prior Publication Data

US 2012/0241873 A1    Sep. 27, 2012

(51) Int. Cl.
*H01L 21/02* (2006.01)
*H01L 21/3205* (2006.01)

(52) U.S. Cl.
USPC .................. 257/410; 257/310; 438/595

(58) Field of Classification Search
USPC .................. 257/310, 410; 438/595
See application file for complete search history.

(56) References Cited

U.S. PATENT DOCUMENTS

| | | | |
|---|---|---|---|
| 3,636,493 A | 1/1972 | Caddock |
| 5,030,588 A | 7/1991 | Hosaka |
| 5,126,279 A | 6/1992 | Roberts |
| 5,128,745 A | 7/1992 | Takasu |
| 5,319,319 A | 6/1994 | Kerth |
| 5,498,768 A | 3/1996 | Nishitani |
| 5,563,096 A | 10/1996 | Nasr |
| 5,915,203 A | 6/1999 | Sengupta |
| 5,950,090 A | 9/1999 | Chen |
| 6,025,267 A | 2/2000 | Pey |
| 6,043,157 A | 3/2000 | Gardner |
| 6,096,659 A | 8/2000 | Gardner |
| 6,100,118 A | 8/2000 | Shih |
| 6,162,584 A | 12/2000 | Chen |
| 6,210,999 B1 * | 4/2001 | Gardner et al. .......... 438/183 |
| 6,251,761 B1 | 6/2001 | Rodder |
| 6,291,282 B1 | 9/2001 | Wilk |
| 6,303,418 B1 | 10/2001 | Cha |
| 6,380,104 B1 * | 4/2002 | Yu .......................... 438/776 |
| 6,406,956 B1 | 6/2002 | Tsai |
| 6,444,139 B1 | 9/2002 | Minamihaba |
| 6,458,684 B1 | 10/2002 | Guo |
| 6,506,682 B1 | 1/2003 | Lee |
| 6,514,827 B2 | 2/2003 | Kim |
| 6,524,920 B1 * | 2/2003 | Yu .......................... 438/303 |
| 6,573,134 B2 | 6/2003 | Ma |
| 6,653,698 B2 | 11/2003 | Lee |
| 6,674,138 B1 | 1/2004 | Halliyal |
| 6,696,345 B2 | 2/2004 | Chau |
| 6,743,669 B1 | 6/2004 | Lin |
| 6,790,719 B1 | 9/2004 | Adetutu |
| 6,794,234 B2 | 9/2004 | Polishchuk |
| 6,797,622 B2 | 9/2004 | Brask |
| 6,825,117 B2 | 11/2004 | Miller |
| 6,841,484 B2 | 1/2005 | Ying |
| 6,867,084 B1 | 3/2005 | Chiu |
| 6,872,627 B2 | 3/2005 | Chen |
| 6,872,655 B2 | 3/2005 | Mahalingam |
| 6,902,969 B2 | 6/2005 | Adetutu |
| 6,924,184 B2 | 8/2005 | Cave |
| 6,960,416 B2 | 11/2005 | Mui |

(Continued)

*Primary Examiner* — Jarrett Stark
*Assistant Examiner* — Nicholas Tobergte
(74) *Attorney, Agent, or Firm* — Winston Hsu; Scott Margo (57) ABSTRACT

A semiconductor device is disclosed. The semiconductor device includes: a substrate; a gate structure disposed on the substrate, wherein the gate structure comprises a high-k dielectric layer; and a first seal layer disposed on a sidewall of the gate structure, wherein the first seal layer is an oxygen-free seal layer.

10 Claims, 7 Drawing Sheets

(56) References Cited

U.S. PATENT DOCUMENTS

| Patent No. | Date | Name | Ref |
|---|---|---|---|
| 7,012,027 B2 | 3/2006 | Perng | |
| 7,045,428 B2 | 5/2006 | Brask | |
| 7,064,066 B1 | 6/2006 | Metz | |
| 7,078,282 B2 | 7/2006 | Chau | |
| 7,081,409 B2 * | 7/2006 | Kang et al. | 438/681 |
| 7,098,516 B2 | 8/2006 | Colombo | |
| 7,108,579 B2 | 9/2006 | Wada | |
| 7,109,079 B2 | 9/2006 | Schaeffer, III | |
| 7,112,486 B2 | 9/2006 | Cho | |
| 7,126,199 B2 | 10/2006 | Doczy | |
| 7,138,323 B2 | 11/2006 | Kavalieros | |
| 7,148,100 B2 * | 12/2006 | Kim et al. | 438/218 |
| 7,148,548 B2 | 12/2006 | Doczy | |
| 7,153,784 B2 | 12/2006 | Brask | |
| 7,157,378 B2 | 1/2007 | Brask | |
| 7,160,767 B2 | 1/2007 | Brask | |
| 7,166,913 B2 | 1/2007 | Chinthakindi | |
| 7,183,184 B2 | 2/2007 | Doczy | |
| 7,186,605 B2 | 3/2007 | Cheng | |
| 7,196,010 B2 | 3/2007 | Park | |
| 7,208,361 B2 | 4/2007 | Shah | |
| 7,217,611 B2 | 5/2007 | Kavalieros | |
| 7,314,793 B2 | 1/2008 | Frohberg | |
| 7,381,608 B2 | 6/2008 | Brask | |
| 7,381,619 B2 | 6/2008 | Wang | |
| 7,488,656 B2 | 2/2009 | Cartier | |
| 7,517,746 B2 | 4/2009 | Lin | |
| 7,553,732 B1 | 6/2009 | Brown | |
| 7,556,998 B2 | 7/2009 | Park | |
| 7,569,443 B2 * | 8/2009 | Kavalieros et al. | 438/183 |
| 7,652,332 B2 * | 1/2010 | Cartier et al. | 257/347 |
| 7,704,833 B2 * | 4/2010 | Lindert et al. | 438/259 |
| 7,723,196 B2 * | 5/2010 | Guha et al. | 438/299 |
| 7,812,411 B2 * | 10/2010 | Cheng | 257/410 |
| 7,888,195 B2 * | 2/2011 | Lin et al. | 438/199 |
| 2002/0127888 A1 | 9/2002 | Cho | |
| 2003/0003645 A1 | 1/2003 | Besser | |
| 2003/0166338 A1 | 9/2003 | Ahn | |
| 2004/0007561 A1 | 1/2004 | Nallan | |
| 2005/0239273 A1 | 10/2005 | Yang | |
| 2005/0253173 A1 | 11/2005 | Wang | |
| 2005/0275035 A1 | 12/2005 | Mathew | |
| 2006/0001095 A1 | 1/2006 | Doris | |
| 2006/0024953 A1 | 2/2006 | Papa | |
| 2006/0102963 A1 | 5/2006 | Huang | |
| 2006/0102964 A1 | 5/2006 | Huang | |
| 2006/0160303 A1 | 7/2006 | Ang | |
| 2007/0037335 A1 | 2/2007 | Chambers | |
| 2007/0138559 A1 | 6/2007 | Bohr | |
| 2007/0145591 A1 | 6/2007 | Yano | |
| 2007/0148838 A1 | 6/2007 | Doris | |
| 2007/0210354 A1 | 9/2007 | Nabatame | |
| 2007/0262451 A1 | 11/2007 | Rachmady | |
| 2008/0029478 A1 | 2/2008 | Hsu | |
| 2008/0173947 A1 | 7/2008 | Hou | |
| 2008/0224235 A1 | 9/2008 | Lavoie | |
| 2008/0311713 A1 | 12/2008 | Lu | |
| 2009/0050972 A1 | 2/2009 | Lindsay | |
| 2009/0057769 A1 | 3/2009 | Wei | |
| 2009/0057787 A1 | 3/2009 | Matsuki | |
| 2009/0101989 A1 | 4/2009 | Chen | |
| 2009/0134466 A1 | 5/2009 | Cho | |
| 2009/0181504 A1 | 7/2009 | Lin | |
| 2009/0186458 A1 | 7/2009 | Yu | |
| 2009/0206415 A1 | 8/2009 | Chiang | |
| 2009/0236669 A1 | 9/2009 | Chen | |
| 2009/0258482 A1 | 10/2009 | Lin | |
| 2010/0052074 A1 | 3/2010 | Lin | |
| 2010/0059833 A1 | 3/2010 | Yu | |
| 2010/0065926 A1 | 3/2010 | Yeh | |
| 2010/0068877 A1 | 3/2010 | Yeh | |
| 2010/0099229 A1 | 4/2010 | Chiu | |
| 2010/0148263 A1 | 6/2010 | Chiu | |

* cited by examiner

SEMICONDUCTOR DEVICE

BACKGROUND OF THE INVENTION

1. Field of the Invention

The invention relates to a semiconductor device, and more particularly, to a semiconductor device with metal gate and method for fabricating the same.

2. Description of the Prior Art

With a trend towards scaling down size of the semiconductor device, conventional methods, which are used to achieve optimization, such as reducing thickness of the gate dielectric layer, for example the thickness of silicon dioxide layer, have faced problems such as leakage current due to tunneling effect. In order to keep progression to next generation, high-K materials are used to replace the conventional silicon oxide to be the gate dielectric layer because it decreases physical limit thickness effectively, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus work function metals are developed to replace the conventional polysilicon gate to be the control electrode that competent to the high-K gate dielectric layer.

However, there is always a continuing need in the semiconductor processing art to develop semiconductor device renders superior performance and reliability even though the conventional silicon dioxide or silicon oxynitride gate dielectric layer is replaced by the high-K gate dielectric layer and the conventional polysilicon gate is replaced by the metal gate.

SUMMARY OF THE INVENTION

It is an objective of the present invention to provide a semiconductor device with metal gate and method for fabricating the same.

According to a preferred embodiment of the present invention, a semiconductor device is disclosed. The semiconductor device includes: a substrate; a gate structure disposed on the substrate, wherein the gate structure comprises a high-k dielectric layer; and a first seal layer disposed on a sidewall of the gate structure, wherein the first seal layer is an oxygen-free seal layer.

According to another aspect of the present invention, a method for fabricating semiconductor device is disclosed. The method includes the steps of: providing a substrate; forming a gate structure on the substrate, wherein the gate structure comprises a high-k dielectric layer; forming a first seal layer on a sidewall of the gate structure; and forming a lightly doped drain in the substrate adjacent to two sides of the gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
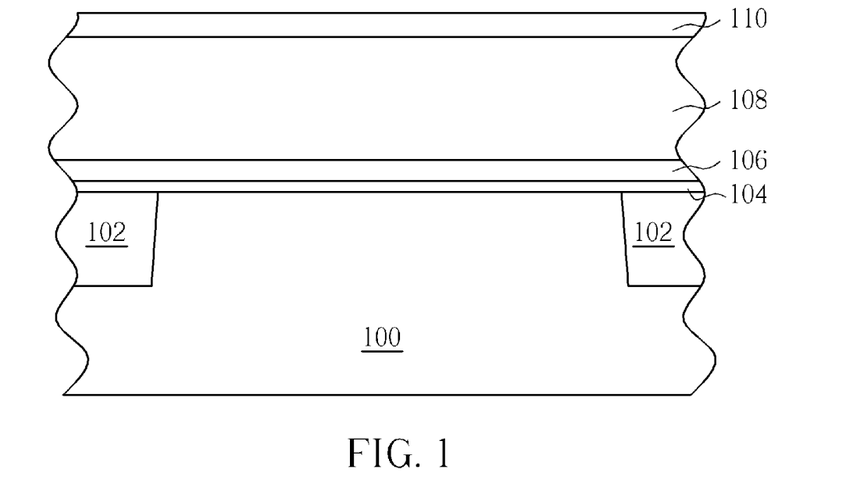
FIGS. 1-6 illustrate a method for fabricating a semiconductor device having metal gate.

Referring to FIGS. 1-6, FIGS. 1-6 illustrate a method for fabricating a semiconductor device having metal gate, in which the method preferably conducts a gate-first approach accompanying a high-k first fabrication. As shown in FIG. 1, a substrate 100, such as a silicon substrate or a silicon-in-insulator (SOI) substrate is provided. A plurality of shallow trench isolations (STI) 102 used for electrical isolation is also formed in the substrate 100.

Next, a gate insulating layer 104 composed of oxide or nitride is formed on the surface of the substrate 100, in which the gate insulating layer 104 is preferably used as an interfacial layer. Next, a stacked film composed of a high-k dielectric layer 106, a polysilicon layer 108, and a hard mask 110 is formed on the gate insulating layer 104. The polysilicon layer 108 is preferably used as a sacrificial layer, which could be composed of undoped polysilicon, polysilicon having n+ dopants, or amorphous polysilicon material.

The high-k dielectric layer 106 could be a single-layer or a multi-layer structure containing metal oxide layer such as rare earth metal oxide, in which the dielectric constant of the high-k dielectric layer 106 is substantially greater than 20. For example, the high-k dielectric layer 106 could be selected from a group consisting of hafnium oxide ($HfO_2$), hafnium silicon oxide (HfSiO), hafnium silicon oxynitride (HfSiON), aluminum oxide (AlO), lanthanum oxide ($La_2O_3$), lanthanum aluminum oxide (LaAlO), tantalum oxide, $Ta_2O_3$, zirconium oxide ($ZrO_2$), zirconium silicon oxide (ZrSiO), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). The hard mask 110 could be composed of $SiO_2$, SiN, SiC, or SiON.

Figure 2:
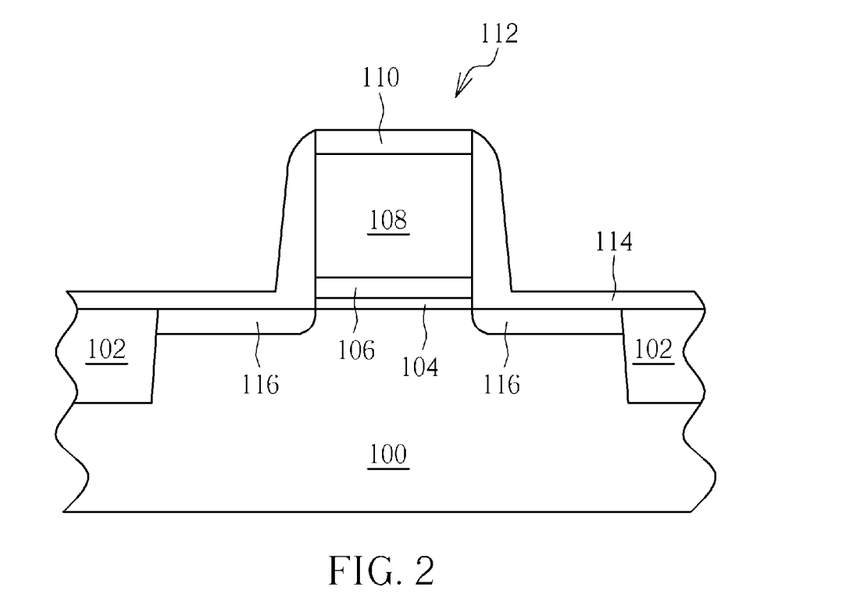

Next, as shown in FIG. 2, a patterned photoresist (not shown) is formed on the hard mask 110, and a pattern transfer is performed by using the patterned photoresist as mask to partially remove the hard mask 110, the polysilicon layer 108, the high-k dielectric layer 106, and the gate insulating layer 104 through single or multiple etching processes. After stripping the patterned photoresist, a gate structure 112 is formed on the substrate 100.

Next, a first seal layer 114 composed of silicon nitride is formed on the sidewall surface of the gate structure 112 and the surface of the substrate 100, and a lightly doped ion implantation is carried out to implant n-type or p-type dopants into the substrate 100 adjacent to two sides of the gate structure 112 for forming a lightly doped drain 116.

Figure 3:
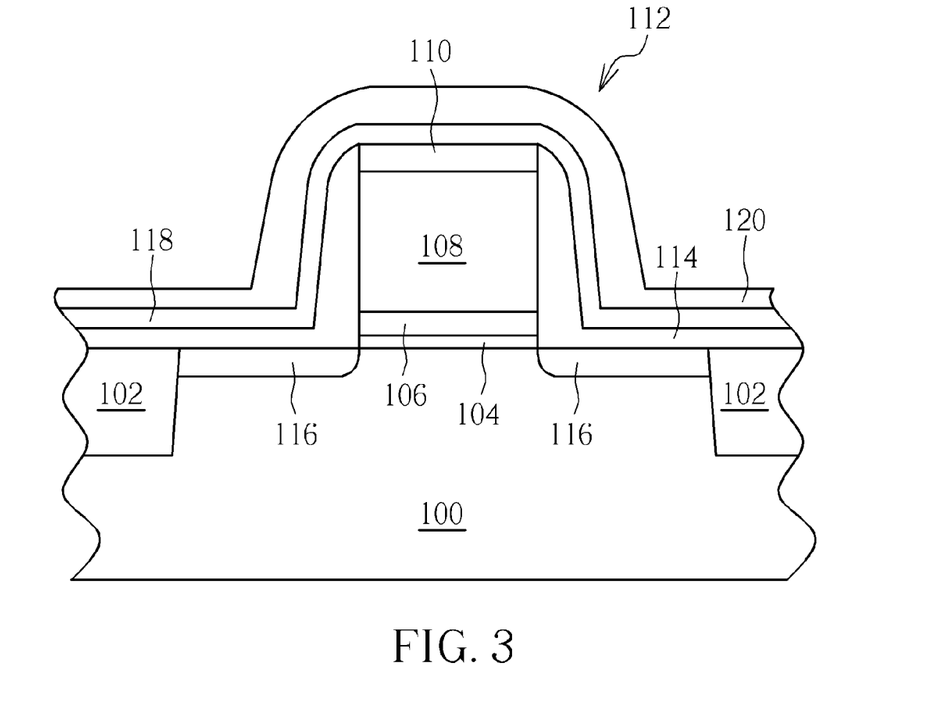

As shown in FIG. 3, a second seal layer 118 composed of silicon oxide and a third seal layer 120 composed of silicon nitride are sequentially formed on the substrate 100 and covering the gate structure 112 and the first seal layer 114. In this embodiment, the second seal layer 118 is preferably composed of silicon oxide and thus having a different etching rate with respect to the first seal layer 114 underneath.

Figure 4:
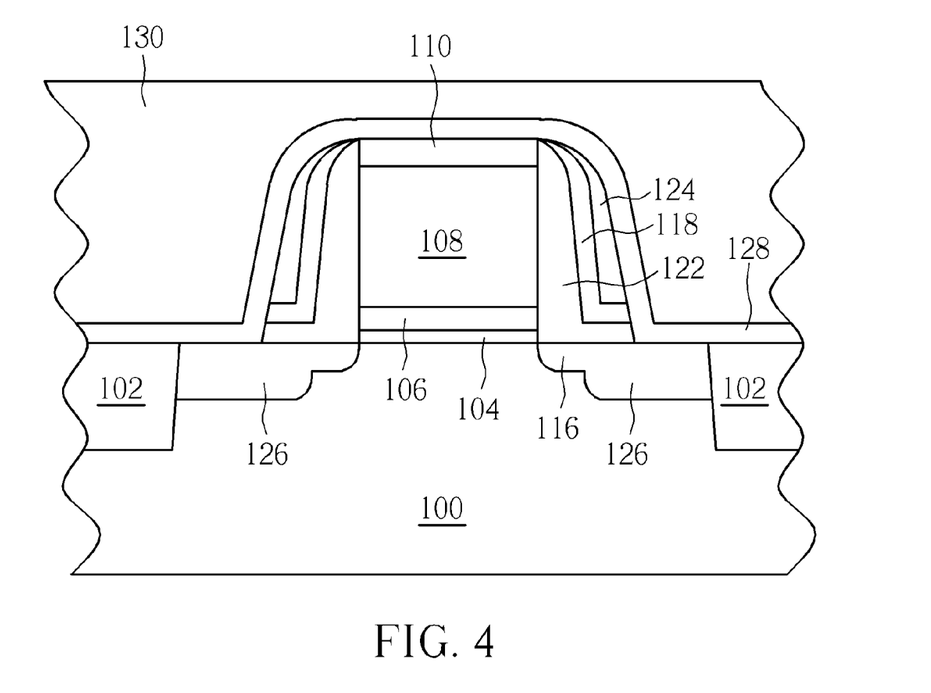

Next, as shown in FIG. 4, a dry etching process is performed to partially remove the third seal layer 120 and stop on the surface of the second seal layer 118, another dry etching is carried out to partially remove the second seal layer 118 and the first seal layer 114, and a wet etching process is performed to remove remaining polymers from the above etching process for forming a first spacer 122 composed of L-shaped first seal layer, an L-shaped second seal layer 118, and a second spacer 124 composed of the remaining third seal layer 120 on the sidewall of the gate structure 112.

In an alternative approach to the above steps, another embodiment of the present invention could also perform a dry etching process to partially remove the third seal layer 120 and stop on the surface of the second seal layer 118, perform another dry etching process to partially remove the third seal layer 118, and perform a wet etching process to partially remove the first seal layer 114 for forming the above L-shaped first spacer 122, the L-shaped second seal layer 118, and the second spacer 124.

Next, an ion implantation process is performed to implant n-type or p-type dopants into the substrate 100 adjacent to two sides of the aforementioned spacer for forming a source/drain region 126. In this embodiment, a selective strain scheme (SSS) can be used for forming the source/drain region 126. For example, a selective epitaxial growth (SEG) can be used to form the source/drain region 126, such that when the source/drain region 126 is a p-type source/drain, epitaxial silicon layers with silicon germanium (SiGe) can be used to form the p-type source/drain region 126, whereas when the source/drain region 126 is an n-type source/drain region 126, epitaxial silicon layers with silicon carbide (SiC) can be used to form the n-type source/drain region 126. Additionally, silicides (not shown) are formed on the surface of the source/drain region 126. Thereafter, a contact etch stop layer (CESL) 128 and an inter-layer dielectric (ILD) 130 layer are sequentially formed on the substrate 100. Since the steps of forming the above mentioned elements are well-known to those skilled in the art, the details of which are omitted herein for the sake of brevity.

Figure 5:
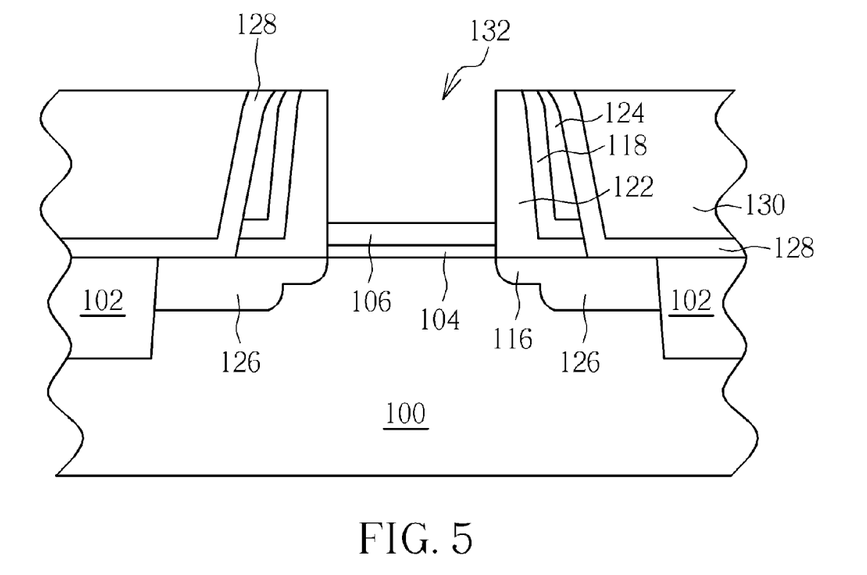

As shown in FIG. 5, a planarizing process, such as a chemical mechanical polishing (CMP) is conducted to partially remove the ILD layer 130, the CESL 128, and the patterned hard mask 110 until exposing the polysilicon layer 108. Another adequate etching process could then be carried to remove the polysilicon layer 108 to form a trench 132. During this step, the high-k dielectric layer 106 could be used as an etching stop layer to protect the gate insulating layer 104 underneath from the etching process conducted previously. As the aforementioned planarizing process and etching process are well known to those skilled in the art, the details of which are omitted herein for the sake of brevity.

Figure 6:
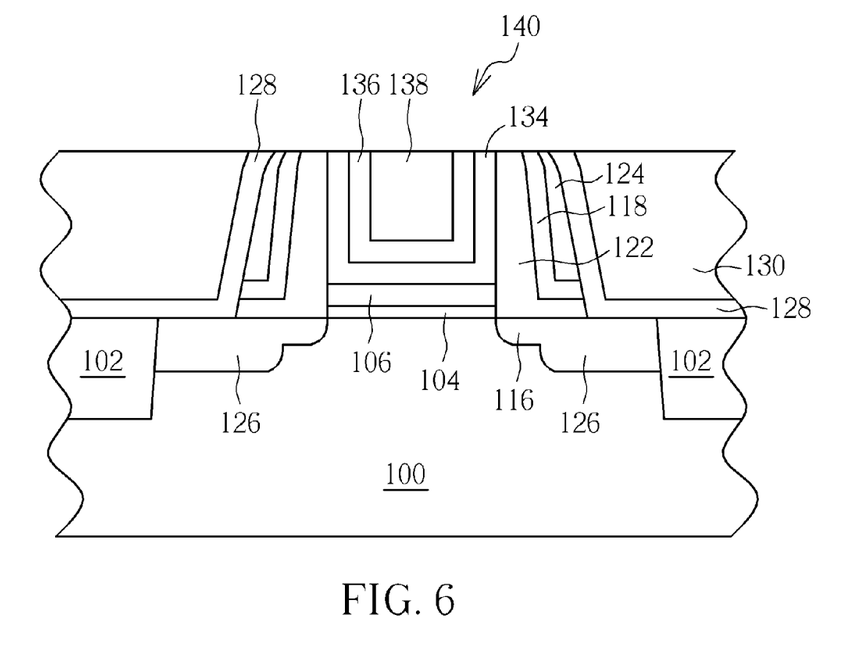

Next, as shown in FIG. 6, a work function metal layer 134, a barrier layer 136, and a low resistance metal layer 138 are formed sequentially to fill the trench 132, in which the work functional metal layer 134 could include a p-type work function metal or an n-type work functional metal. A planarizing process is conducted thereafter to partially remove the low resistance metal layer 138, the barrier layer 136, and work function metal layer 134 for completing the fabrication of a semiconductor device having metal gate 140.

Referring to FIGS. 7-12, FIGS. 7-12 illustrate a method for fabricating a semiconductor device having metal gate according to another embodiment of the present invention, in which this embodiment also employs a gate-first fabrication with a high-k first process.

Figure 7:
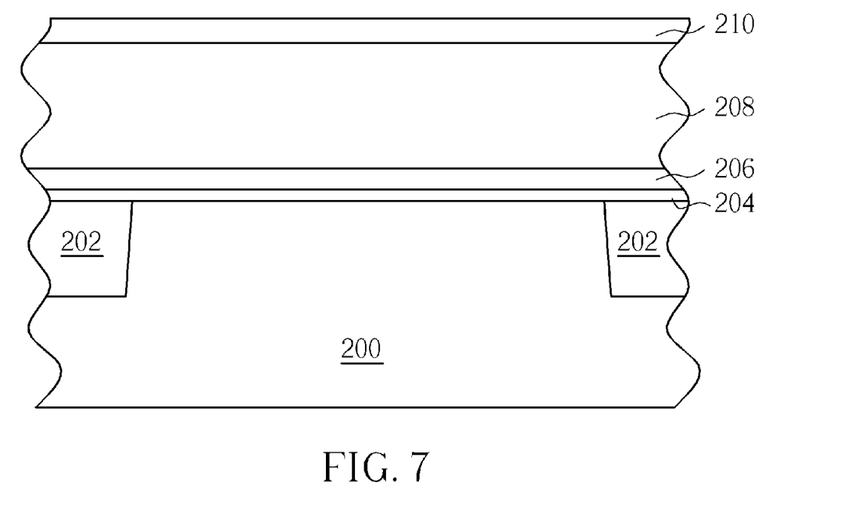
FIGS. 7-12 illustrate a method for fabricating a semiconductor device having metal gate according to another embodiment of the present invention.

As shown in FIG. 7, a substrate 200, such as a silicon substrate or a silicon-in-insulator (SOI) substrate is provided. A plurality of shallow trench isolations (STI) 202 used for electrical isolation is also formed in the substrate 200.

Next, a gate insulating layer 204 composed of oxide or nitride is formed on the surface of the substrate 200, in which the gate insulating layer 204 is preferably used as an interfacial layer. Next, a stacked film composed of a high-k dielectric layer 206, a polysilicon layer 208, and a hard mask 210 is formed on the gate insulating layer 204. The polysilicon layer 208 is preferably used as a sacrificial layer, which could be composed of undoped polysilicon, polysilicon having n+ dopants, or amorphous polysilicon material.

Figure 8:
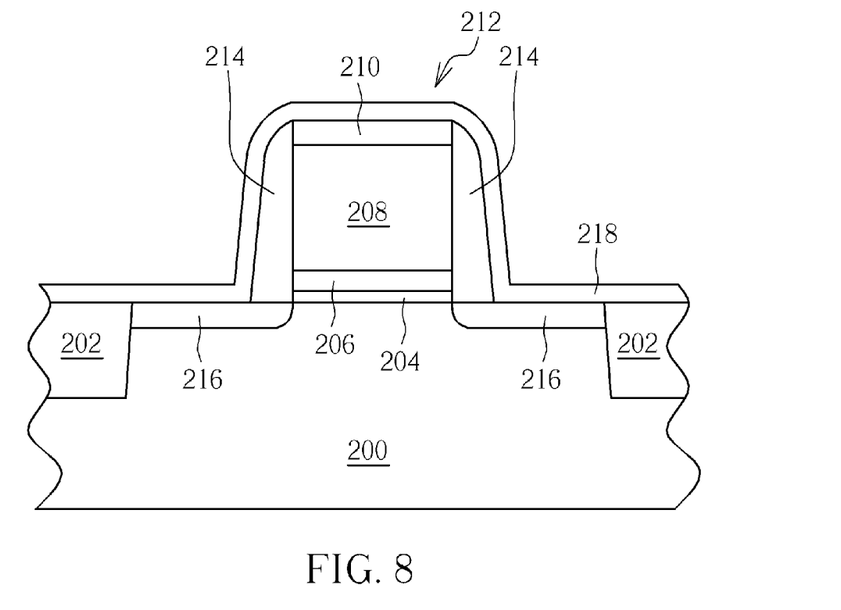

Next, as shown in FIG. 8, a patterned photoresist (not shown) is formed on the hard mask 210, and a pattern transfer is performed by using the patterned photoresist as mask to partially remove the hard mask 210, the polysilicon layer 208, the high-k dielectric layer 206, and the gate insulating layer 204 through single or multiple etching processes. After stripping the patterned photoresist, a gate structure 212 is formed on the substrate 200.

Next, a first seal layer (not shown) composed of silicon nitride is formed on the sidewall surface of the gate structure 212 and the surface of the substrate 200, and an etching back process performed to partially remove the first seal layer on the substrate 200 for forming a first spacer 214 on the sidewall of the gate structure 212. Next, a lightly doped ion implantation is carried out to implant n-type or p-type dopants into the substrate 200 adjacent to two sides of the gate structure 212 for forming a lightly doped drain 216. A second seal layer 218 composed of silicon oxide is then covered on the gate structure 212, the first spacer 214, and the surface of the substrate 200.

Figure 9:
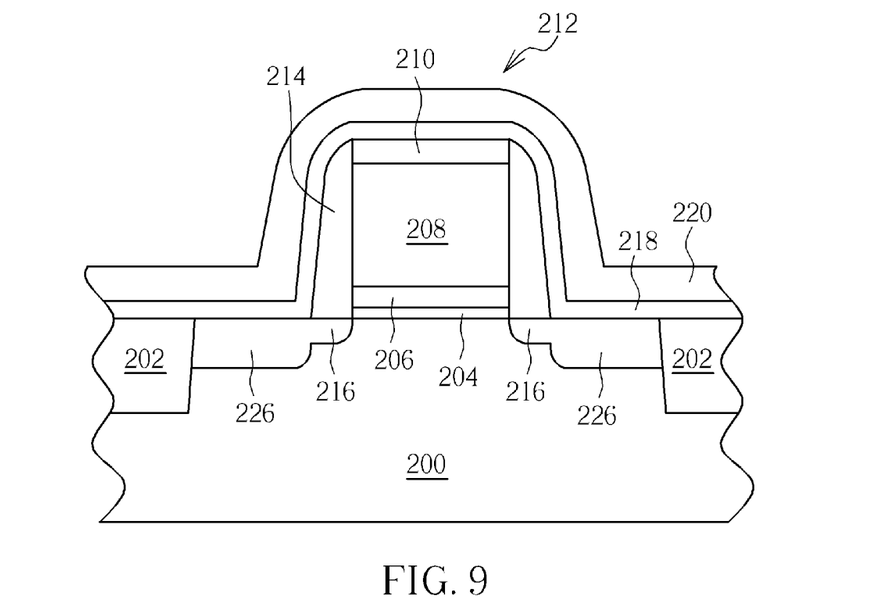

As shown in FIG. 9, a third seal layer 220 composed of silicon nitride is formed on the substrate 200 and covering the gate structure 212 and the second seal layer 218. In this embodiment, the second seal layer 218 is preferably composed of silicon oxide and thus having a different etching rate with respect to the third seal layer 220 above.

Figure 10:
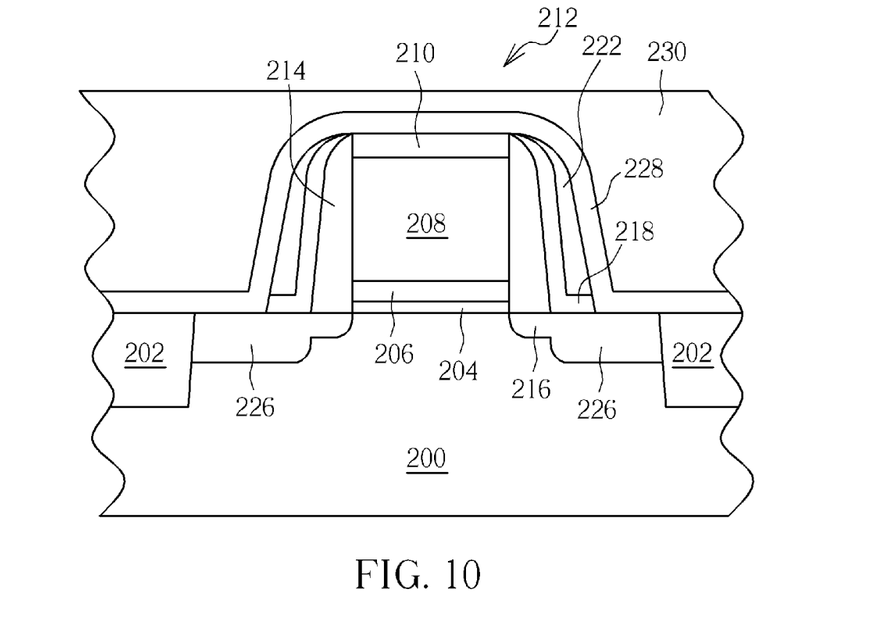

As shown in FIG. 10, a dry etching process is performed to partially remove the third seal layer 220 and stop on the surface of the second seal layer 218, and a wet etching process is performed to partially remove the second seal layer 218 for forming a first spacer 214, an L-shaped second seal layer 218, and a second spacer 222 on the sidewall of the gate structure 212.

Next, an ion implantation process is performed to implant n-type or p-type dopants into the substrate 200 adjacent to two sides of the aforementioned spacer for forming a source/drain region 226. In this embodiment, a selective strain scheme (SSS) can be employed for forming the source/drain region 226. For example, a selective epitaxial growth (SEG) can be used to form the source/drain region 226, such that when the source/drain region 226 is a p-type source/drain, epitaxial silicon layers with silicon germanium (SiGe) can be used to form the p-type source/drain region 226, whereas when the source/drain region 226 is an n-type source/drain region 226, epitaxial silicon layers with silicon carbide (SiC) can be used to form the n-type source/drain region 226. Additionally, silicides (not shown) are formed on the surface of the source/drain region 226. Thereafter, a contact etch stop layer (CESL) 228 and an inter-layer dielectric (ILD) 230 layer are sequentially formed on the substrate 200. Since the steps of forming the above mentioned elements are well-known to those skilled in the art, the details of which are omitted herein for the sake of brevity.

Figure 11:
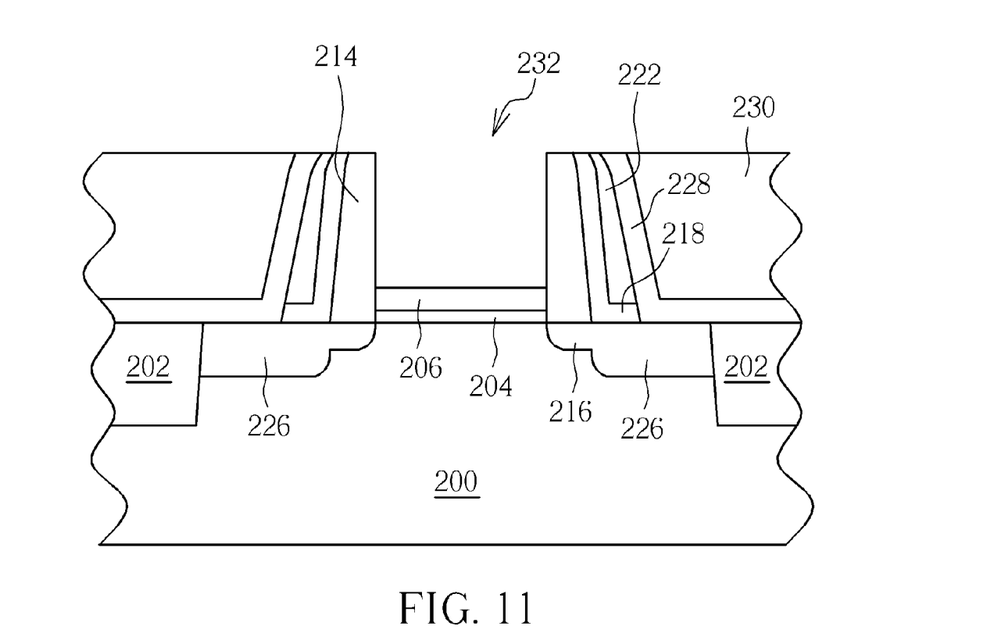

As shown in FIG. 11, a planarizing process, such as a chemical mechanical polishing (CMP) is conducted to partially remove the ILD layer 230, the CESL 228, and the hard mask 210 until exposing the polysilicon layer 208. Another adequate etching process could then be carried to remove the polysilicon layer 208 to form a trench 232. In this step, the high-k dielectric layer 206 could be served as an etching stop layer to protect the gate insulating layer 204 underneath from the etching process conducted previously. As the aforementioned planarizing process and etching process are well known to those skilled in the art, the details of which are omitted herein for the sake of brevity.

Figure 12:
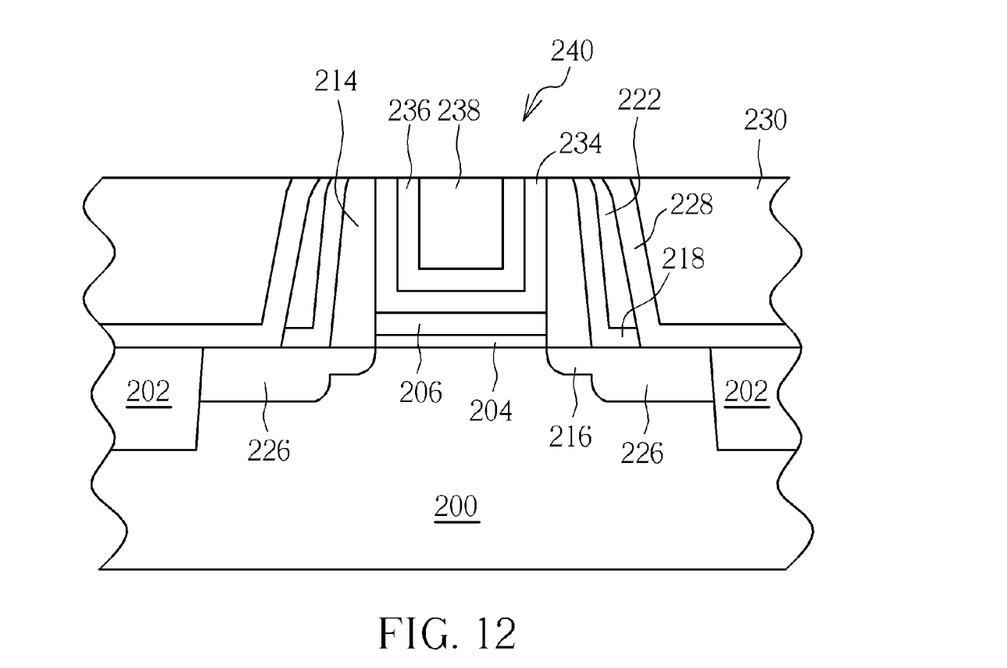

Next, as shown in FIG. 12, a work function metal layer 234, a barrier layer 236, and a low resistance metal layer 238 are formed sequentially to fill the trench 232, in which the work functional metal layer 234 could include a p-type work function metal or an n-type work functional metal. A planarizing process is conducted thereafter to partially remove the low resistance metal layer 238, the barrier layer 236, and work function metal layer 234 for completing the fabrication of a semiconductor device having metal gate 240.

Overall, the present invention preferably forms an oxygen-free seal layer on the sidewall of the gate structure to protect the high-k dielectric layer in the gate structure before a lightly doped drain is formed. According to a preferred embodiment of the present invention, the oxygen-free seal layer is preferably composed of silicon nitride, and is adhered and contacting the hard mask, the polysilicon layer, the high-k dielectric layer, and gate insulating layer of the gate structure. As no material layer is formed on the sidewall of the gate structure for protecting the high-k dielectric layer before the formation of lightly doped drain in conventional art, the high-k dielectric layer is often damaged or removed during later processes including the wet cleaning conducted for lightly doped drain, oxide stripping, or spacer removal. By forming an oxygen-free seal layer on the sidewall of the gate structure before forming the lightly doped drain, the present invention could avoid the aforementioned problem found in conventional art and prevent the high-k dielectric layer from damage effectively.

Figure 13:
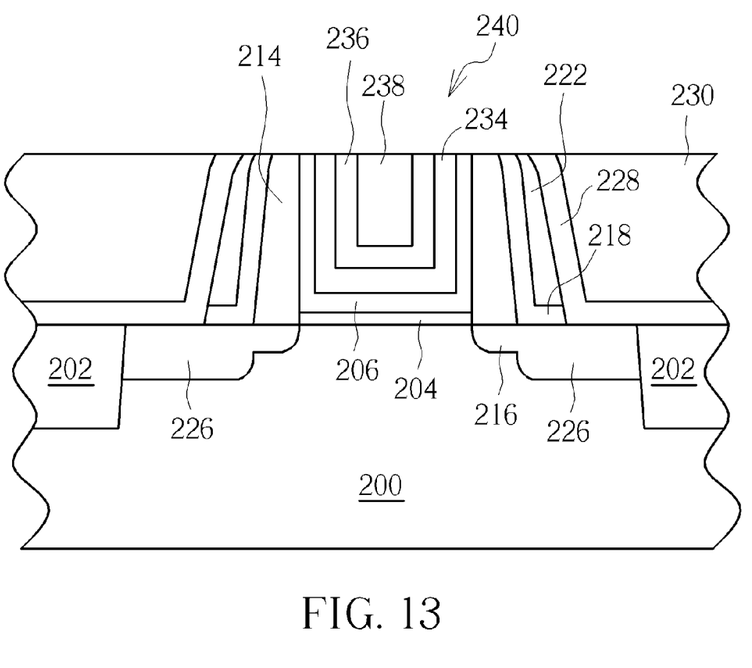
FIG. 13 illustrates a semiconductor device having metal gate according to an embodiment of the present invention.

It should be noted that despite the aforementioned embodiment employs a gate-first and h-k first approach, the fabrication process of the present invention could also be applied to gate-first fabrication and high-k last fabrication, which are all within the scope of the present invention. For instance, the gate structure of the gate-first process preferably includes a gate insulating layer, a high-k dielectric layer disposed on the gate insulating layer and a polysilicon gate disposed on the high-k dielectric layer, in which the high-k dielectric layer preferably to be a linear high-k dielectric layer. The gate structure of a high-k last fabrication on the other hand, as shown in FIG. 13, includes a gate insulating layer 204, a high-k dielectric layer 206 disposed on the gate insulating layer 204, and a metal gate 240 disposed on the high-k dielectric layer 206, in which the high-k dielectric layer 206 is a U-shaped high-k dielectric layer.

Those skilled in the art will readily observe that numerous modifications and alterations of the device and method may be made while retaining the teachings of the invention.

What is claimed is:

1. A semiconductor device, comprising:
a substrate;
a gate structure disposed on the substrate, wherein the gate structure comprises a high-k dielectric layer, wherein the high-k dielectric layer is U-shaped;
a first seal layer disposed on a sidewall of the gate structure, wherein the first seal layer is an oxygen-free seal layer and a first spacer, and is non-L-shaped; and
a second seal layer disposed on a sidewall of the first spacer, wherein the second seal layer comprises a material different from the first seal layer, and the second seal layer comprises an L-shaped seal layer.

2. The semiconductor device of claim 1, wherein the etching rate of the second seal layer is different from the etching rate of the first seal layer.

3. The semiconductor device of claim 1, further comprising a second spacer disposed on the second seal layer.

4. The semiconductor device of claim 1, wherein the gate structure comprises:
a gate insulating layer;
the high-k dielectric layer disposed on the gate insulating layer; and
a polysilicon gate disposed on the high-k dielectric layer.

5. The semiconductor device of claim 1, wherein the gate structure comprises:
a gate insulating layer;
the high-k dielectric layer disposed on the gate insulating layer; and
a metal gate disposed on the high-k dielectric layer.

6. A method for fabricating semiconductor device, comprising:
providing a substrate;
forming a gate structure on the substrate;
forming a first seal layer on a sidewall of the gate structure, wherein the first seal layer is an oxygen-free seal layer and a first spacer, and is non-L-shaped;
forming a lightly doped drain in the substrate adjacent to two sides of the gate structure;
forming a L-shaped second seal layer on a sidewall of the first spacer, wherein the L-shaped second seal layer comprises a material different from the first seal layer; and
forming a U-shaped high-k dielectric layer in the gate structure.

7. The method of claim 6, wherein after forming the lightly doped drain further comprises:
performing a first etching process to partially remove the first seal layer before forming the lightly doped drain for forming the remaining first seal layer into a first spacer on the sidewall of the gate structure;
forming a second seal layer on the gate structure, the first spacer, and the substrate;
forming a third seal layer on the second seal layer;
performing a second etching process to partially remove the third seal layer for forming a second spacer; and
performing a third etching process to partially remove the second seal layer for forming the L-shaped second seal layer on a sidewall of the first spacer.

8. The method of claim 7, wherein the first seal layer comprises silicon nitride, the second seal layer comprises silicon oxide, and the third seal layer comprises silicon nitride.

9. The method of claim 7, wherein the first etching process comprises an etching back process, the second etching process comprises a dry etching process, and the third etching process comprises a wet etching process.

10. A semiconductor device, comprising:
a substrate;
a gate structure disposed on the substrate, wherein the gate structure comprises a high-k dielectric layer, wherein the high-k dielectric layer is U-shaped;
a first seal layer disposed on a sidewall of the gate structure, wherein the first seal layer is an oxygen-free seal layer non-L-shaped; and
a second seal layer disposed on a sidewall of the first seal layer, wherein the second seal layer comprises a material different from the first seal layer and the second seal layer is L-shaped.

* * * * *